(12) United States Patent
Song et al.

(10) Patent No.: US 7,338,747 B2
(45) Date of Patent: Mar. 4, 2008

(54) PHOTORESIST COMPOSITION AND METHOD PATTERN FORMING USING THE SAME

(75) Inventors: Tsing-Tang Song, Ilan (TW); Chih-Shin Chuang, Hsinchu (TW); Wei-Chan Tseng, Tainan (TW); Kuen-Yuan Hwang, Taipei (TW); Tsung-Yu Chen, Taipei (TW)

(73) Assignees: Industrial Technology Research Institute, Hsinchu (TW); Chang-Chun Plastics Co., Ltd., Hsinchu County (TW)

(*) Notice: Subject to any disclaimer, the term of this patent is extended or adjusted under 35 U.S.C. 154(b) by 82 days.

(21) Appl. No.: 10/720,966

(22) Filed: Nov. 24, 2003

(65) Prior Publication Data

US 2004/0142272 A1    Jul. 22, 2004

(30) Foreign Application Priority Data

Dec. 19, 2002    (TW) .............................. 91136684 A

(51) Int. Cl.
*G03F 7/029* (2006.01)
*G03F 7/031* (2006.01)
*G03F 7/032* (2006.01)
*G03F 7/033* (2006.01)

(52) U.S. Cl. ............................. 430/280.1; 430/281.1; 430/287.1; 430/288.1

(58) Field of Classification Search ............. 430/281.1, 430/288.1, 287.1, 280.1
See application file for complete search history.

(56) References Cited

U.S. PATENT DOCUMENTS

| | | | |
|---|---|---|---|
| 6,140,025 A * | 10/2000 | Imai et al. | 430/325 |
| 6,306,555 B1 * | 10/2001 | Schulz et al. | 430/270.1 |
| 6,399,277 B1 * | 6/2002 | Nojima et al. | 430/280.1 |
| 6,602,651 B1 * | 8/2003 | Yoshitake et al. | 430/280.1 |
| 6,660,457 B1 * | 12/2003 | Imai et al. | 430/315 |
| 2002/0177073 A1* | 11/2002 | Melisaris et al. | 430/280.1 |
| 2003/0009053 A1* | 1/2003 | Nishikubo et al. | 560/208 |

* cited by examiner

*Primary Examiner*—John S. Chu
(74) *Attorney, Agent, or Firm*—Thomas, Kayden, Horstemeyer & Risley

(57) ABSTRACT

This invention relates to a negative photoresist composition with multi-reaction models. When the photoresist composition according to the present invention is used in photolithography processes employing UV light to produce cross-link reactions and multi-reactions including radical polymerization and cationic polymerization also occur. The photoresist composition can be used to control light reaction efficiency and increase reaction thoroughness, thus obtaining a high resolution pattern.

5 Claims, 3 Drawing Sheets

PHOTORESIST COMPOSITION AND METHOD PATTERN FORMING USING THE SAME

BACKGROUND OF THE INVENTION

1. Field of the Invention

The invention relates to a photoresist composition and method of pattern forming using the same. More particularly, the present invention relates to a photoresist composition with multi-reaction systems and method of pattern forming using the same.

2. Description of the Related Art

With the progress of IC technologies, thin film photolithography has developed from G-line and I-line to deep UV and photoresist resolution processes have improved from 1 μm to less than 90 nm.

To conform to various electronics and optoelectronics requirements circuit board technology is evolving toward high density interconnection, fine pitch, and high aspect ratio. The thick film photolithography is the predominate process used in the above circuit board technology, and offers improved exposure by employing uniform ultraviolet (365 nm±10%) light as an exposure source.

The photoresist used in photolithography is usually dry film or liquid photoresist 10~50 μm thick and with a 50 μm optimum resolution. Due to the multiple layer, and high distribution density requirements, the application of the present technology is limited. The circuit board requires a greater number of layers number to accommodate the longer circuit and the increased number of I/O points. Moreover, as electronic products become thinner and smaller, high density interconnection (HDI) substrates are the primary method of reducing manufacturing cost while maintaining the desired product size. Thus, photoresist resolution must be reduced to at least 10~25 μm. Therefore, developing a simple photoresist technology offering a complete figure, high aspect ratio, and superior resolution is necessary.

Currently the optimum HDI resolution is 50 μm as disclosed in U.S. Pat. No. 3,953,309, 5,087,552, and 5,609,991. The conventional photoresist technology employs a negative mono-reaction type (free radical polymerization) photoresist using UV radiation to perform photolithography for a high density interconnection substrate.

When forming a high resolution photoresist pattern (with spacing width of less than 50 μm) using a conventional photoresist composition, the residual photoresist is difficult to remove and creates uneven surfaces due to defects such as distortion, swelling or raising, resulting from light scattering during exposure and the incomplete reaction of photoresist composition, hence, the photolithography resolution is limited.

The negative photoresist composition based on free-radical polymerization is highly reactive rate after exposure. The uniformity of reaction suffers, however, due to the occurrence of complex and uncontrollable side-reactions resulting from the high reactivity of free-radicals. Thus, photoresist defects, such as distortion, swelling and raising, frequently remain after high resolution photolithography.

SUMMARY OF THE INVENTION

Accordingly, an object of the present invention is to provide a negative photoresist composition with multi-reaction systems. In the UV photolithography process, the negative photoresist composition undergoes a cross-link reaction, and the multi-reaction systems perform simultaneously, wherein a multi-reaction system comprises free-radical polymerization and cation polymerization providing increased control and uniformity of reaction. As a result, the negative photoresist composition with multi-reaction systems can be employed in advanced photolithographic processes for various kinds of electronic devices and as it offers excellent cross-sectional profile, high fidelity and alkali resistance. Moreover, high resolution (10-25 μm), high density interconnection substrates can be obtained by the photolithography process employing negative photoresist composition according to the present invention.

Another object of the present invention is to provide a method of forming a photoresist pattern using the negative photoresist composition according to the present invention to substantially prevent problems resulting from the limitations and disadvantages of conventional methods.

To achieve the object of the present invention a negative photoresist composition with multi-reaction systems comprising, a uniform solution in an organic solvent, at least one saturated or unsaturated resin, at least one photoinitiator, at least one free radical reactive monomer, at least one photo-acid generator, and at least one cation reactive monomer is provided.

The present invention additionally provides a method of pattern forming using the previously described photoresist composition, including the following steps. A photoresist film is first formed on a substrate using a negative photoresist composition according to the present invention. Next, a photoresist film with a predetermined pattern is exposed to an actinic ray or radiation. Finally, the photoresist film is developed with an alkaline developing solution to form a photoresist pattern.

In the present invention, the actinic ray can be uniform ultraviolet light with a wavelength of about 365 nm.

A detailed description is given in the following embodiments with reference to the accompanying drawings

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

Figure 1A:
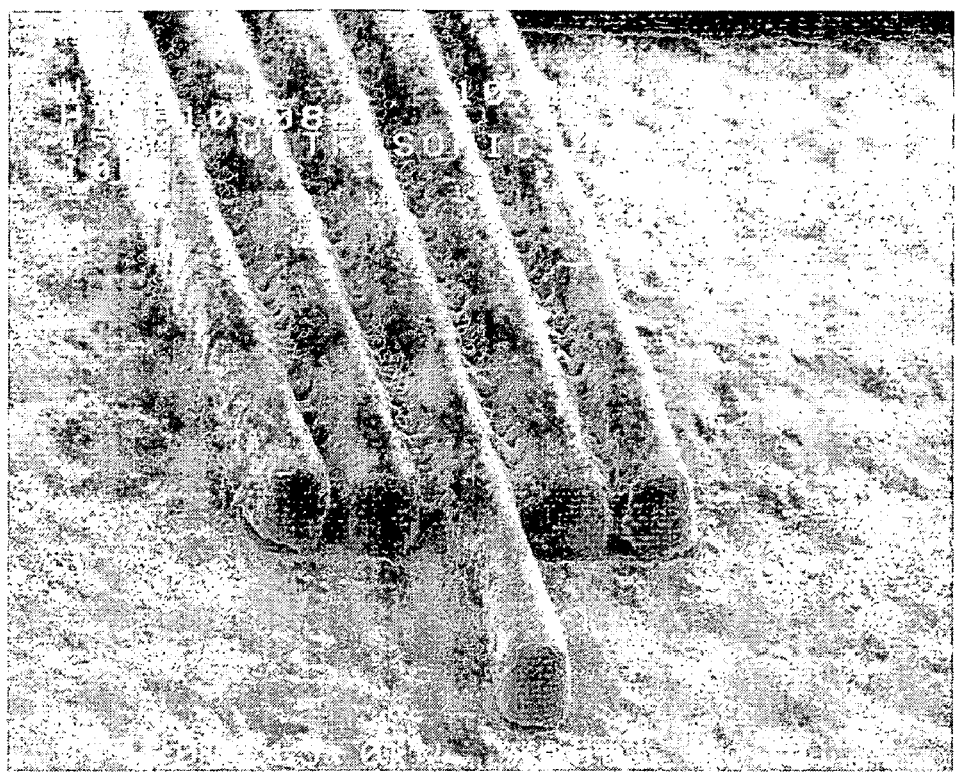
FIGS. 1a and 1b are scanning electron microscope (SEM) photographs illustrating comparative example 1.

In order to further understand the present invention, the components of the negative photoresist composition are described in the following.

According to the present invention, the resin employed in the present invention has a molecular weight of between 5,000 and 250,000, and an acid value between 50 and 250 mgKOH/g. Preferably, the molecular weight of the resin is between 10,000 and 100,000, and has an acid value between 70 and 150 mgKOH/g. The resin can also be a polymer with unsaturated bonds, and the examples include, but are not limited to, homopolymers and copolymers of at least one monomer selected from styrene, methyl styrene, acrylic acid, acrylate, methyl acrylic acid, methyl acrylate, vinyl ether, or derivatives thereof. Moreover, the resin can be acrylic resin, polyester, polyurethane, polyether, epoxy acrylate, or combinations thereof.

The photoinitiator suitable for use in the present invention is an agent which generates free radical species through decomposition by irradiation, such as benzoin, benzoin alkyl ether, benzil ketals, acetophenones derivatives, benzophenone, 4,4'-dimethyl-aminobenzophenone, thioxanthones derivatives, morpholino-1-propanone, and combinations thereof. In addition, the at least one photoinitiator is preferably present in an amount of 0.1-35 parts by weight, most preferably 1-10 parts by weight, based on 100 parts by weight of the at least one saturated or unsaturated resin.

The free radical reactive monomer is a monomer which can be polymerized in the presence of free radicals, such as tetraethylene glycol diacrylate, tetraethylene glycol dimethacrylate, neopentylglycol diacrylate, neopentylglycol dimethyl acrylate, polyethylene glycol diacrylate, polyethylene glycol dimethylacrylate, ethoxylated bisphenol A glycol diacrylate, ethoxylated bisphenol A glycol dimethyl acrylate, trimethylolpropane trimethacrylate, trimethylolpropane triacrylate, pentaerythritol triacrylate, ethoxylated trimethylolpropane triacrylate, glyceryl propoxy triacrylate, pentaerythritol tetraacrylate, dipentaerythritol pentaacrylate, glycidyl acrylate, glycidylmethyl acrylate, p-epoxy-styrene, p-glycidyl-styrene, allyl glycidyl ether, 3-glycidyloxy-propy 1-trimethoxy silane, β-(3,4-epoxycyclohexyl)-ethyl trimethoxysilane, γ-glycidoxypropyl trimethoxysilane, and combinations thereof. In addition, the at least one free radical reactive monomer is preferably present in an amount of 0.1-100 parts by weight, most preferably 5-25 parts by weight, based on 100 parts by weight of the at least one saturated or unsaturated resin.

The photoacid generator suitable for use in the present invention is not particularly specific and can be any photoacid generator which produces acids by decomposition due to irradiation, such as onium salt, triarylsulfonium salt, alkylarylsulfonium salt, diaryliodonium salt, diarylchloronium salt, diarylbromonium salts, sulfonates, diazonium salt, diazonaphthoquinone sulfonate, and combinations thereof. The examples of triarylsulfonium salt include, but are not limited to, triaryl sulfonium hexafluorophosphate, triphenyl triflate, triphenyl stibnite, methoxy triphenyl triflate, methoxy triphenyl stibnite, and trimethyl triphenyl triflate. In addition, the at least one photoacid generator is preferably present in an amount of 0.1-35 parts by weight, most preferably 0.1-10 parts by weight, based on 100 parts by weight of the at least one saturated or unsaturated resin.

The cation reactive monomer can be a vinyl ether monomer or an epoxy monomer, such as cycloaliphatic diepoxide, N,N-diglycidyl-4-glycidyloxyaniline, 3,4-epoxycyclohexyl methyl carboxylate, 3,4-epoxycyclohexane carboxylate, 1,2-cyclohexane diglycidyl dicarboxylate, 1,4-cyclohexane dimethanol diglycidyl ether, ethylene glycol divinyl ether, diethylene glycol divenyl ether, triethylene glycol divinyl ether, 1,4-cyclohexane dimethanol divinyl ether, lactones or combinations thereof. In addition, the at least one cation reactive monomer is preferably present in an amount of 0.1-35 parts by weight, most preferably 5-25 parts by weight, based on 100 parts by weight of the at least one saturated or unsaturated resin.

While the essential ingredients in the photoresist composition according to the present invention are the above described components, it is optional that the inventive photoresist composition is admixed with at least one epoxy resin and/or at least one resin hardener. These additional components are known and conventionally employed in negative photoresist compositions.

The epoxy resin can be bisphenol A epoxy resin, brominated epoxy resin, phenolic novolac epoxy resin, cresol novolac epoxy resin, naphthalene epoxy, dicyclopendiene novolac epoxy, cycloaliphatic epoxy, isocyanate epoxy and combinations thereof. In addition, the at least one epoxy resin is preferably present in an amount of 0.1-50 parts by weight, based on 100 parts by weight of the at least one saturated or unsaturated resin.

The resin hardener can be aliphatic amine, aromatic amine, polyamide, dicyandiamide, imidazoles, anhydride, and combinations thereof.

The present invention is novel in that the negative photoresist composition according to the present invention undergoes a cross-link reaction to simultaneously polymerize free-radicals and cations. The photoresist composition has high photosensitivity, and storage stability due to the characteristics of multi-reaction systems. A feature of the present invention is that the negative photoresist composition includes various components which perform free-radical polymerizations and cation polymerizations respectively by irradiation. Furthermore, the amounts of each component in the negative photoresist composition are designed within a particular range, resulting in improved control and uniformity of reaction.

The photoresist composition according to the present invention is negative and alkali-soluble. When the negative photoresist composition is exposed to actinic rays or radiation, the negative photoresist composition undergoes a cross-link reaction to simultaneously polymerize free-radicals and cations resulting from acids and free-radical species introduced by decomposition of photoinitiator and photoacid generator due to irradiation. After exposure to irradiation, the exposed negative photoresist composition is rendered alkali-insoluble, and can be removed by a weak alkaline solution.

The following comparative embodiments and embodiments are intended to illustrate the invention more fully without limiting their scope, as numerous modifications and variations will be apparent to those skilled in the art.

FIRST COMPARATIVE EXAMPLE

Resin A (acrylic resin, sold and manufactured under the trade number of 500 by Chang Chun Plastic Co., Ltd) having a molecular weight of 98500 and an acid value of 174 mg-KOH/g was dissolved in propylene glycol monomethyl ether acetate (PMA) to prepare a resin solution having a resin content of about 30%.

A mixture of 20.0 g of the obtained resin solution, 0.5 g of 2, 4, or 6-trimethyl benzoyl diphenyl phosphine oxide (TPO) as a photoinitiator, 0.8 of Irgacure 907 (available from Ciba Geigy), and 0.20 g of isothioxanthone (ITX) was added into a round-bottom flask at room temperature.

After mixing completely, 2.25 g of ditrimethylolpropane tetraacrylate (SR-355), 2.31 g of dipentaerythritol monohydroxy pentaacrylate (SR-399), and 1.5 g of ethoxylated bisphenol A diacrylate (SR-349) were added to the resulting mixture. After mixing completely, a conventional negative photoresist composition was provided.

The ingredients and amounts of the above photoresist composition are shown in Table 1.

TABLE 1

| Component | Wt % |
| --- | --- |
| Resin A | 21.8 |
| TPO | 50.8 |
| PMA | 1.8 |
| Irgacure 907 | 2.9 |
| ITX | 0.7 |
| SR-355 | 8.2 |
| SR-399 | 8.4 |
| SR-349 | 5.4 |

The photoresist composition as described above was coated on a copper clad laminate with a thickness of 10 μm, and the photoresist patterns were designed respectively with a line/space resolution of 10 μm and 15 μm to obtain a 1:1 line/space ratio. After exposure to uniform ultraviolet light with a wavelength of about 365 nm and exposure energy of 150 mJ/cm2, the sample was developed by 1% sodium carbonate solution with ultrasonic agitation at 30° C. for 40 seconds to dissolve the unexposed area. The photoresist was developed to the ninth step in the Stouffer 21 step guide.

Figure 1B:
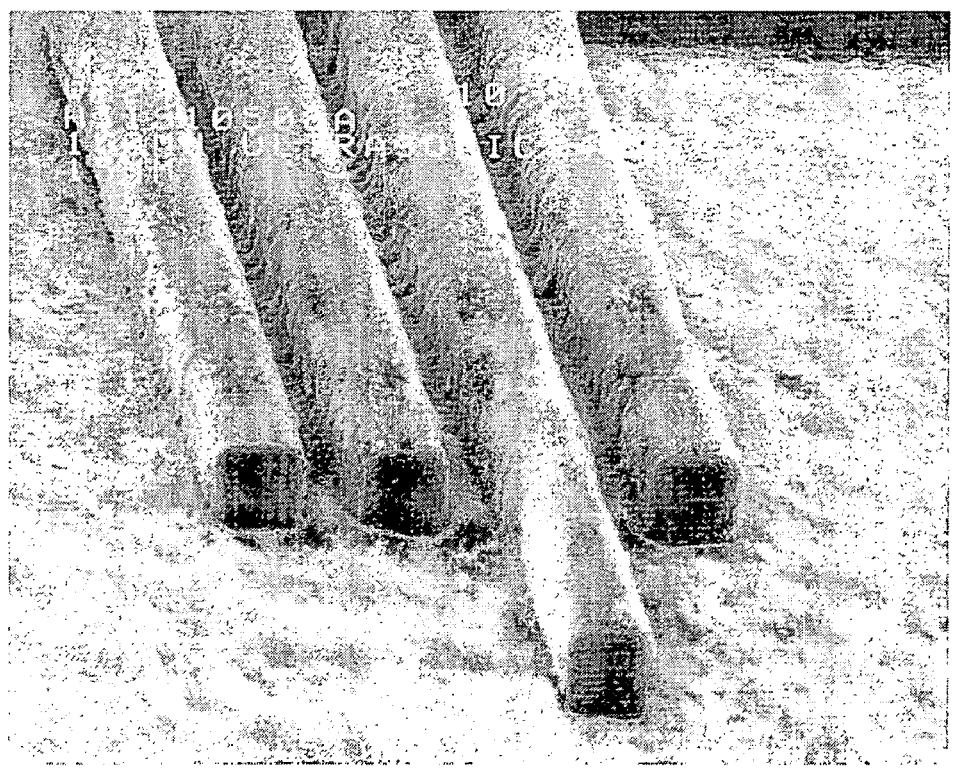

The resist pattern after development was subjected to a scanning electronic microscopy (SEM) photographic observation, as shown in FIGS. 1a and 1b. The obtained photoresist patterns had line widths of 13 μm and 20 μm respectively, and 10 μm and 15 μm with pre-determined designs. Individual line/space ratios were 2.2/1 and 2/1. In addition, photoresist defects, such as swelling and rising, were clearly observed in the SEM photographs of comparative example 1.

SECOND COMPARATIVE EXAMPLE

Resin B (styrene acrylic resin, sold and manufactured under the trade number of Joncryl 690 by Johnson Polymer) having a molecular weight of 16500, a modified acid value of 200 mg-KOH/g and an unsaturated group of $7.13\times10^{-4}$ mol/g was dissolved in propylene glycol monomethyl ether acetate (PMA) to yield a resin solution with resin content of about 40%.

A mixture of 20.0 g of the obtained resin solution, 2.0 g of 2, 4, or 6-trimethyl benzoyl diphenyl phosphine oxide (TPO) as a photoinitiator, 1.54 g of ditrimethylolpropane tetraacrylate (SR-355), 0.75 g of dipentaerythritol monohydroxy pentaacrylate (SR-399), and 1.5 of ethoxylated bisphenol diacrylate (SR-349) was added into a round-bottom flask at room temperature. After mixing completely, a conventional negative photoresist composition was provided.

The ingredients and amounts of the above photoresist composition are shown in Table 2.

TABLE 2

| Component | Wt % |
| --- | --- |
| Resin B | 31.0 |
| TPO | 7.8 |
| PMA | 46.5 |
| SR-355 | 6.0 |
| SR-399 | 2.9 |
| SR-349 | 5.8 |

The photoresist composition as described above was coated on a copper clad laminate with a thickness of 10 μm. After exposure to uniform ultraviolet light with a wavelength of about 365 nm and exposure energy of 100 mJ/cm2, the sample was developed by 1% sodium carbonate solution with ultrasonic agitation for 12 seconds to dissolve the unexposed area. The photoresist was developed to the ninth step in the Stouffer 21 step guide.

The resist pattern after development was subjected to scanning electronic microscopy (SEM) photographic observation. The line/space resolution of the obtained photoresist pattern was at least 25 μm wide when the line/space ratio was 1:1.

THIRD COMPARATIVE EXAMPLE

Resin A (acrylic resin, sold and manufactured under the trade number of 500 by Chang Chun Plastic Co., Ltd) having a molecular weight of 98500 and an acid value of 174 mg-KOH/g was dissolved in propylene glycol monomethyl ether acetate (PMA) to prepare a resin solution with resin content of about 30%.

A mixture of 20.0 g of the obtained resin solution, 4.5 g of o-cresol novolac epoxy resin (sold and manufactured under the trade number of CNE200 by Chang Chun Plastic Co., Ltd) was added into a round-bottom flask at room temperature.

After mixing completely, 1.5 g of cycloaliphatic diepoxide (SarCat®K126), 0.6 g of triaryl sulfonium hexafluorophosphate (50% in Propylene Carbonate) (SarCat®KI85), and 0.075 isothioxanthone (ITX) were added to the resulting mixture. After mixing completely, a conventional negative photoresist composition was provided.

The ingredients and amounts of the above photoresist composition are shown in Table 3.

TABLE 3

| Component | Wt % |
| --- | --- |
| Resin A | 20.85 |
| PMA | 55.95 |
| CNE2000 | 15.649 |
| SarCat ®K126 | 5.21 |
| SarCat ®K185 | 2.08 |
| ITX | 0.26 |

The photoresist composition as described above was coated on a copper clad laminate with a thickness of 10 μm. After exposure to scattering ultraviolet light with a wavelength of 200 to 400 nm and exposure energy of 500 mJ/cm2, the sample was subjected to a post-exposure bake (PEB) at 95° C. for 300 seconds. The sample was subsequently developed by 1% sodium carbonate solution with ultrasonic agitation for 70 seconds to dissolve the unexposed area.

The resist pattern after development was subjected to a scanning electronic microscopy (SEM) photographic observation. The line/space resolution of the obtained photoresist pattern is at least 30 μm when the line/space ratio was 1:1. The photoresist composition had the disadvantages of scattering exposure source and higher desired exposure energy.

FOURTH COMPARATIVE EXAMPLE

Resin A (acrylic resin, sold and manufactured under the trade number of 500 by Chang Chun Plastic Co., Ltd) having a molecular weight of 98500 and an acid value of 174 mg-KOH/g was dissolved in propylene glycol monomethyl ether acetate (PMA) to prepare a resin solution having a resin content of about 30%.

A mixture of 20.0 g of the obtained resin solution, 1.5 g of cycloaliphatic diepoxide (SarCat®K126), 3.03 g of 1,1,1-tris-(p-hydroxyphenyl) ethane glycidyl ether (THPE-GE) was added to a round-bottom flask at room temperature.

After mixing completely, 1.212 g of triaryl sulfonium hexafluorophosphate (50% in Propylene Carbonate) (SarCat®KI85), and 0.152 isothioxanthone (ITX) were added to the resulting mixture. After mixing completely, a conventional negative photoresist composition was provided.

The ingredients and amounts of the above photoresist composition are shown in Table 4.

TABLE 4

| Component | Wt % |
|---|---|
| Resin A | 20.88 |
| PMA | 51.05 |
| THPE-GE | 11.05 |
| SarCat ®K126 | 11.05 |
| SarCat ®K185 | 4.42 |
| ITX | 0.55 |

The photoresist composition as described above was coated on a copper clad laminate with a thickness of 10 μm, and the photoresist patterns were designed respectively with a line/space resolution of 10 μm and 15 μm to obtain a 1:1 line/space ratio. After exposure to uniform ultraviolet light with a wavelength of about 365 nm and exposure energy of 700 mJ/cm², the sample was subjected to a post-exposure bake (PEB) at 95° C. for 300 seconds. The sample was subsequently developed by 1% sodium carbonate solution with ultrasonic agitation 90 seconds to dissolve the unexposed area.

Figure 2A:
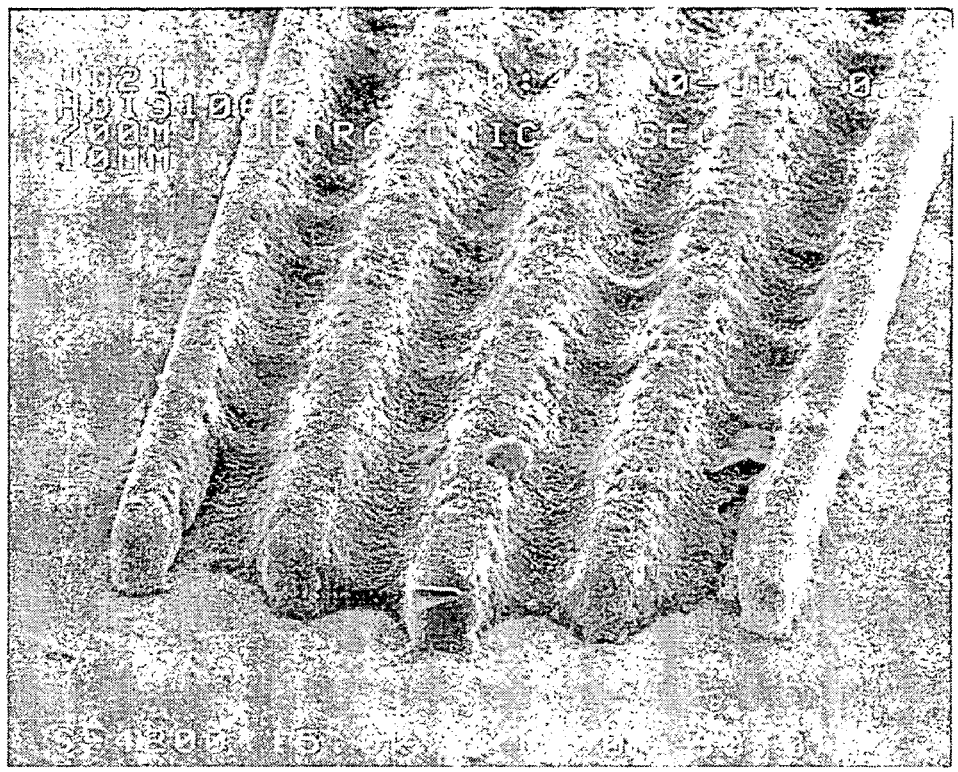
FIGS. 2a and 2b are scanning electron microscope (SEM) photographs illustrating comparative example 4.
Figure 2B:
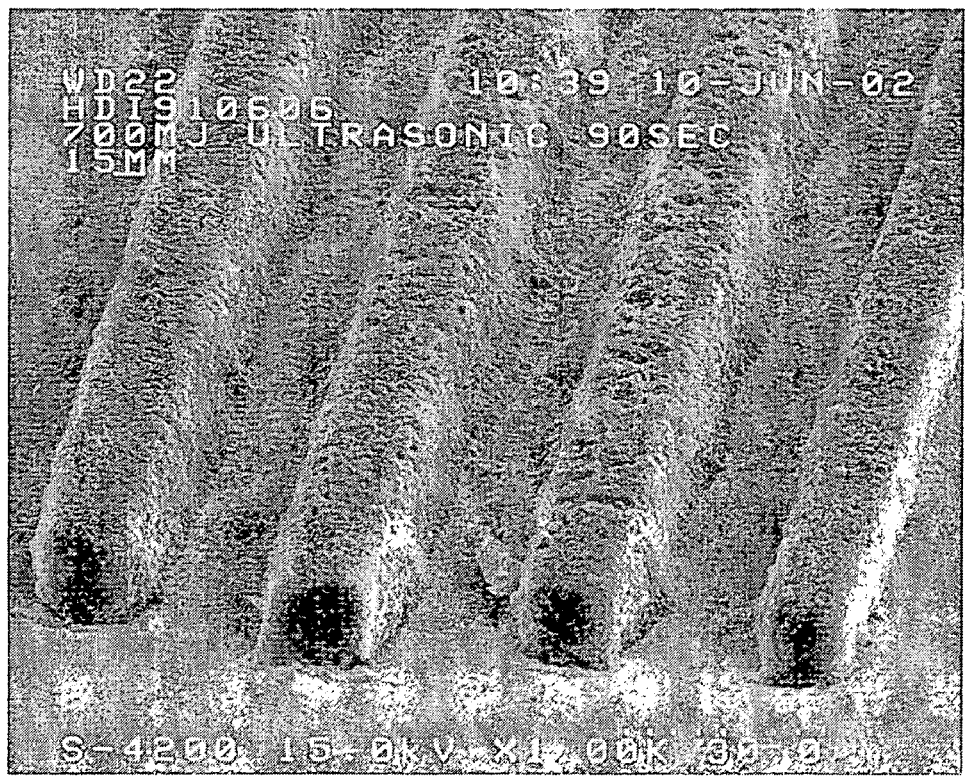

The resist pattern after development was subjected to a scanning electronic microscopy (SEM) photographic observation, as shown in FIGS. 2a and 2b. The obtained photoresist patterns had line widths of 9 μm and 13 μm respectively, with widths as low as 10 μm and 15 μm with pre-determined designs, and the individual line/space ratio was 0.8/1. In addition, photoresist defects, such as swelling and rising, were clearly observed in the SEM photographs of comparative example 4. Moreover, the desired exposure energy of the above composition was higher.

FIRST EXAMPLE

Resin A (acrylic resin, sold and manufactured under the trade number of 500 by Chang Chun Plastic Co., Ltd) having a molecular weight of 98500 and an acid value of 174 mg-KOH/g was dissolved in propylene glycol monomethyl ether acetate (PMA)to prepare a resin solution having a resin content of about 30%.

A mixture of 20.0 g of the obtained resin solution, 0.5 g of 2, 4, or 6-trimethyl benzoyl diphenyl phosphine oxide (TPO) as a photoinitiator, 0.8 of Irgacure 907 (available from Ciba Geigy), and 0.20 g of isothioxanthone (ITX) was added into a round-bottom flask at room temperature.

After mixing completely, 2.31 g of ditrimethylolpropane tetraacrylate (SR-355), 2.25 g of dipentaerythritol monohydroxy pentaacrylate (SR-399), 1.5g of ethoxylated bisphenol A diacrylate (SR-349), 0.125 g PS-104 (trade number, sold and manufactured by KOYO Chemical Ins.) as a photoinitiator, and 2.0 g of ethylene glycol divinyl ether were added to the resulting mixture. After mixing completely, the negative photoresist composition according to the present invention was provided.

The ingredients and amounts of the above photoresist composition are shown in Table 5.

TABLE 5

| Component | Wt % |
|---|---|
| Resin A | 20.2 |
| TPO | 47.2 |
| PMA | 1.7 |
| Irgacure 907 | 2.7 |
| ITX | 1.0 |
| SR-355 | 7.6 |
| SR-399 | 7.8 |
| SR-349 | 5.1 |
| PS-104 | 0.4 |
| Ethylene Glycol Divinyl Ether | 6.7 |

The photoresist composition as described above was coated on a copper clad laminate with a thickness of 10 μm, and the photoresist pattern was designed with a line/space resolution of 20 μm with a 1:1 line/space ratio. After exposure to uniform ultraviolet light with a wavelength of about 365 nm and exposure energy of 260 mJ/cm², the sample was developed by 1% sodium carbonate solution with ultrasonic agitation for 23 seconds with spray pressure of 1.0 kg/cm² to dissolve the unexposed area. The photoresist was developed to the ninth step in the Stouffer 21 step guide.

The resist pattern after development was subjected to a scanning electronic microscopy (SEM) photographic observation. The obtained photoresist patterns had line widths of 20 μm and line/space ratio of 1/1, corresponding predetermined designs.

SECOND EXAMPLE

Resin A (acrylic resin, sold and manufactured under the trade number of 500 by Chang Chun Plastic Co., Ltd) having a molecular weight of 98500 and an acid value of 174 mg-KOH/g was dissolved in propylene glycol monomethyl ether acetate (PMA) to prepare a resin solution having a resin content of about 30%.

A mixture of 20.0 g of the obtained resin solution, 0.25 g of 2, 4, or 6-trimethyl benzoyl diphenyl phosphine oxide (TPO) as a photoinitiator, 0.4 of Irgacure 907 (available from Ciba Geigy), and 0.159 g of isothioxanthone (ITX) was added into a round-bottom flask at room temperature.

After mixing completely, 1.967 g of ditrimethylolpropane tetraacrylate (SR-355), 2.02 g of dipentaerythritol monohydroxy pentaacrylate (SR-399), 1.31 g of ethoxylated bisphenol A diacrylate (SR-349), 0.945 g of cycloaliphatic diepoxide (SarCat®K126) as a cation reactive monomer, and 0.473 g of triaryl sulfonium hexafluorophosphate (50% in Propylene Carbonate) (SarCat®K185) as a photoacid generator were added to the resulting mixture. After mixing completely, the negative photoresist composition according to the present invention was provided.

The ingredients and amounts of the above photoresist composition are shown in Table 6.

TABLE 6

| Component | Wt % |
|---|---|
| Resin A | 21.8 |
| TPO | 50.9 |
| PMA | 0.9 |

TABLE 6-continued

| Component | Wt % |
| --- | --- |
| Irgacure 907 | 1.45 |
| ITX | 0.57 |
| SR-355 | 7.15 |
| SR-399 | 7.33 |
| SR-349 | 4.76 |
| SarCat ®K126 | 3.4 |
| SarCat ®K185 | 1.72 |

The photoresist composition as described above was coated on a copper clad laminate with a thickness of 10 µm, and the photoresist pattern is designed with a line/space resolution of 15 µm with a 1:1 line/space ratio. After exposure to uniform ultraviolet light with a wavelength of about 365 nm and exposure energy of 300 mJ/cm$^2$, the sample was subjected to a post-exposure bake at 95° C. for 300 seconds. The sample was subsequently developed by 1% sodium carbonate solution with ultrasonic agitation for 70 seconds to dissolve the unexposed area.

The resist pattern after development was subjected to a scanning electronic microscopy (SEM) photographic observation. The obtained photoresist patterns had line widths of 15 µm and the line/space ratio is 1/1, corresponding to that designed with pre-determined designs.

THIRD EXAMPLE

Resin A (acrylic resin, sold and manufactured under the trade number of 500 by Chang Chun Plastic Co., Ltd) having a molecular weight of 98500 and an acid value of 174 mg-KOH/g was dissolved in propylene glycol monomethyl ether acetate (PMA) to prepare a resin solution having a resin content of about 30%.

A mixture of 20.0 g of the obtained resin solution, 0.125 g of 2, 4, or 6-trimethyl benzoyl diphenyl phosphine oxide (TPO) as a photoinitiator, and 0.2 of Irgacure 907 (available from Ciba Geigy), was added into a round-bottom flask at room temperature.

After mixing completely, 1.125 g of ditrimethylolpropane tetraacrylate (SR-355), 1.155 g of dipentaerythritol monohydroxy pentaacrylate (SR-399), 0.75 g of ethoxylated bisphenol A diacrylate (SR-349), 2.27 g of cycloaliphatic diepoxide (SarCatRK126) as a cation reactive monomer, 0.76 g of 1,1,1-tris-(p-hydroxyphenyl) ethane glycidyl ether (THPE-GE) and 0.61 g of triaryl sulfonium hexafluorophosphate (50% in Propylene Carbonate) (SarCatRK185) as a photoacid generator were added to the resulting mixture. After mixing completely, the negative photoresist composition according to the present invention was provided.

The ingredients and amounts of the above photoresist composition are shown in Table 7.

TABLE 7

| Component | Wt % |
| --- | --- |
| Resin A | 22.23 |
| TPO | 51.88 |
| PMA | 0.46 |
| Irgacure 907 | 0.74 |
| SR-355 | 4.16 |
| SR-399 | 4.28 |
| SR-349 | 2.78 |
| SarCat ®K126 | 8.43 |

TABLE 7-continued

| Component | Wt % |
| --- | --- |
| THPE-GE | 2.8 |
| SarCat ®K185 | 2.24 |

The photoresist composition as described above was coated on a copper clad laminate with a thickness of 10 µm, and the photoresist patterns were designed respectively with line/space resolutions of 10 µm and 15 µm with a 1:1 line/space ratio. After exposure to uniform ultraviolet light with a wavelength of about 365 nm and exposure energy of 300 mJ/cm$^2$, the sample was subjected to a post-exposure bake at 95° C. for 300 seconds. The sample was subsequently developed by 1% sodium carbonate solution with ultrasonic agitation for 10 seconds to dissolve the unexposed area. The photoresist was developed to the seventh step in the Stouffer 21 step guide.

Figure 3A:
FIGS. 3a and 3b are scanning electron microscope (SEM) photographs illustrating comparative example 3.
Figure 3B:

The resist pattern after development was subjected to a scanning electronic microscopy (SEM) photographic observation, as shown in FIGS. 3a and 3b. The obtained photoresist patterns had line widths of 10 µm and 15 µm respectively and the line/space ratios are 1/1, corresponding to a pre-determined design.

The present invention has the following advantages.

After exposure to irradiation, the negative photoresist composition according to the present invention undergoes a cross-link reaction to simultaneously polymerize free radicals and cations. Due to the above multi-reaction systems, the polymerization uniformity of the photoresist composition is increased, and the reactivity of the photoresist composition is also controllable.

When the photoresist composition is coated on a printed circuit board to form a photoresist film and exposed to UV light according to a predetermined pattern and developed with an alkaline developing solution, a photoresist pattern having excellent cross-sectional profile, high fidelity and alkali resistance is formed. Moreover, high density interconnection substrates with high resolution (10-25 µm) can be obtained by a photolithography process employing the negative photoresist composition according to the present invention.

Furthermore, the negative photoresist composition according to the present invention exhibits high photosensitivity. As a result, a source of exposure with lower and uniform energy, such as uniform ultraviolet light, can be used to expose the photoresist composition in the photolithography process in order to prevent the occurrence of the distortion at the edge line of the photoresist pattern.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A negative photoresist composition with multi-reaction systems, comprising the following components as a uniform solution in an organic solvent:
   at least one unsaturated resin having a molecular weight in the range from 10,000 to 100,000 and an acid value between 70 and 150 mgKOH/g, selected from the group consisting of homopolymers, copolymers, and combinations thereof, which the homopolymers and the copolymers are synthesized by at least one monomer selected from the group consisting of styrene, methyl styrene, acrylic acid, acrylate, methyl acrylic acid, methyl acrylate, vinyl ether, and combinations thereof;

at least one photoinitiator in an amount of 0.1 to 10 parts by weight, based on 100 parts by weight of the unsaturated resin, wherein the photoinitiator is selected from the group consisting of benzoin, benzoin alkyl ether, benzil ketals, acetophenones derivatives, benzophenone, 4,4'-dimethyl-amino-benzophenone, thioxanthones derivatives, morpholino-1-propanone, and combinations thereof;

at least one free radical reactive monomer in an amount of 0.1 to 100 parts by weight, wherein the free radical reactive monomer is selected from the group consisting of tetraethylene glycol diacrylate, tetraethylene glycol dimethacrylate, neopentylglycol diacrylate, neopentylglycol dimethyl acrylate, polyethylene glycol diacrylate, polyethylene glycol dimethylacrylate, ethoxylated bisphenol A glycol diacrylate, ethoxylated bisphenol A glycol dimethyl acrylate, trimethylolpropane trimethacrylate, trimethyloipropane triacrylate, pentaerythritol triacrylate, ethoxylated trimethyloipropane triacrylate, glyceryl propoxy triacrylate, pentaerythritol tetraacrylate, dipentaerythritol pentaacrylate, glycidyl acrylate, glycidylmethyl acrylate, p-epoxy-styrene, p-glycidyl-styrene, allyl glycidyl ether, 3-glycidyloxy-propy l-trimethoxy silane, β-(3,4-epoxycyclohexyl)-ethyl trimethoxysilane, γ-glycidoxypropyl trimethoxysilane, and combinations thereof;

at least one photoacid generator in an amount of 0.1 to 35 parts by weight, wherein the photoacid generator is triaryl sulfonium hexafluorophosphate, triphenyl triflate, triphenyl stibnite, methoxy triphenyl triflate, methoxy triphenyl stibnite, trimethyl triphenyl triflate or combinations thereof; and at least one cation reactive monomer in an amount of 0.1 to 35 parts by weight, wherein the cation reactive monomer is selected from the group consisting of cycloaliphatic diepoxide, N,N-diglycidyl-4-glycidyloxyaniline, 3,4-epoxycyclohexylmethyl carboxylate, 3,4-epoxycyclohexane carboxylate, 1,2-cyclohexane diglycidyl dicarboxylate, 1,4-cyclohexane dimethanol diglycidyl ether, ethylene glycol divinyl ether, diethylene glycol divenyl ether, triethylene glycol divinyl ether, 1,4-cyclohexane dimethanol divinyl ether, lactones and combinations thereof;

at least one epoxy resin in an amount of 0.1 to 50 parts by weight, based on 100 parts by weight of the unsaturated resin, wherein the epoxy resin is selected from the group consisting of bisphenol A epoxy resin, brominated epoxy resin, phenolic novolac epoxy resin, cresol novolac epoxy resin, naphthalene epoxy, dicyclopendiene novolac epoxy, cycloaliphatic epoxy, isocyanate epoxy and combinations thereof; and at least one resin hardener in an amount of 0.1 to 30 parts by weight, wherein the the resin hardener is selected from the group consisting of aliphatic amine, aromatic amine, polyamide, dicyandiamide, imidazoles, anhydride and combinations thereof.

2. The negative photoresist composition as claimed in claim 1, wherein the multi-reaction systems comprise free-radical polymerizations and cation polymerizations.

3. The negative photoresist composition as claimed in claim 1, wherein the at least one free radical reactive monomer is present in an amount of 5-25 parts by weight, based on 100 parts by weight of the unsaturated resin.

4. The negative photoresist composition as claimed in claim 1, wherein the at least one photoacid generator is present in an amount of 0.1-10 parts by weight, based on 100 parts by weight of the unsaturated resin.

5. The negative photoresist composition as claimed in claim 1, wherein the at least one cation reactive monomer is present in an amount of 5-25 parts by weight, based on 100 parts by weight of the unsaturated resin.

* * * * *